US011519858B2

(12) United States Patent
Flanagan et al.

(10) Patent No.: US 11,519,858 B2
(45) Date of Patent: Dec. 6, 2022

(54) INDUCED CROSSTALK CIRCUIT FOR IMPROVED SENSOR LINEARITY

(71) Applicant: YSI, INC., Yellow Springs, OH (US)

(72) Inventors: Kevin R. Flanagan, Yellow Springs, OH (US); Steven M. Parmley, Centerville, OH (US); Douglas J. Posey, Thornton, CO (US); Michael Leiss, Versailles, OH (US)

(73) Assignee: YSI, INC., Yellow Springs, OH (US)

( * ) Notice: Subject to any disclaimer, the term of this patent is extended or adjusted under 35 U.S.C. 154(b) by 0 days.

(21) Appl. No.: 17/572,879

(22) Filed: Jan. 11, 2022

(65) Prior Publication Data

US 2022/0221403 A1    Jul. 14, 2022

Related U.S. Application Data

(60) Provisional application No. 63/135,799, filed on Jan. 11, 2021.

(51) Int. Cl.
*H05K 1/02* (2006.01)
*G01N 21/64* (2006.01)
(Continued)

(52) U.S. Cl.
CPC .......... *G01N 21/64* (2013.01); *H05K 1/0216* (2013.01); *H05K 1/111* (2013.01); *H05K 1/181* (2013.01);
(Continued)

(58) Field of Classification Search
CPC ....... H05K 1/2016; H05K 2201/10121; H05K 2201/10151; H05K 1/111; H05K 1/181
See application file for complete search history.

(56) References Cited

U.S. PATENT DOCUMENTS

| | | |
|---|---|---|
| 3,681,689 A | 8/1972 | Correard et al. |
| 4,968,968 A | 11/1990 | Taylor |

(Continued)

FOREIGN PATENT DOCUMENTS

| | | |
|---|---|---|
| CN | 109186646 A | 1/2019 |
| WO | 2020/150711 A1 | 7/2020 |

OTHER PUBLICATIONS

English language Abstract and translation of CN109186646A.
(Continued)

*Primary Examiner* — Sherman Ng
(74) *Attorney, Agent, or Firm* — Ware, Fressola, Maguire & Barber LLP

(57) ABSTRACT

An optical sensor includes a detector having a printed circuit board (PCB) and an inductive loop. The printed circuit board (PCB) has a photodiode cathode pad with a photodiode. The inductive loop is arranged around at least part of the photodiode cathode pad, and configured to receive inductive loop inducing signaling, and provide inductive loop signaling around the at least part of the photodiode cathode pad to provide inductive on the PCB to reduce or substantially eliminate unwanted electrical interference in electrical photodiode signaling provided from the photodiode. The inductive loop includes a trace and at least one via. The trace has a route along a signal path from a transistor collector pin around an LED anode pad. The at least one via is placed between LED anode pads to route the trace on a top side of the PCB, and the trace is routed alongside, near and around the photodiode cathode pad back to the LED anode of the LED anode pad.

20 Claims, 9 Drawing Sheets

(51) Int. Cl.
*H05K 1/11* (2006.01)
*H05K 1/18* (2006.01)
(52) U.S. Cl.
CPC .............. *H05K 2201/10121* (2013.01); *H05K 2201/10151* (2013.01)

(56) References Cited

U.S. PATENT DOCUMENTS

| | | |
|---|---|---|
| 5,700,167 A | 12/1997 | Pharney et al. |
| 5,915,989 A | 6/1999 | Adriaenssens et al. |
| 6,520,807 B2 | 2/2003 | Winings |
| 6,704,277 B1 | 3/2004 | Dabral et al. |
| 6,853,191 B1 | 2/2005 | Miller et al. |
| 6,911,925 B1 | 6/2005 | Slavin |
| 7,106,072 B2 | 9/2006 | Clauss et al. |
| 7,949,979 B1 | 5/2011 | Alexander |
| 8,094,232 B2 | 1/2012 | Kusaka |
| 8,171,794 B2 | 5/2012 | Spahlinger |
| 8,310,265 B2 | 11/2012 | Zjajo et al. |
| 8,481,907 B2 | 7/2013 | Seshadri et al. |
| 9,197,288 B2 | 11/2015 | Mellitz et al. |
| 9,337,893 B2 | 5/2016 | Hollis |
| 9,362,884 B2 | 6/2016 | Moreno Granado et al. |
| 9,692,402 B2 | 6/2017 | Wagh et al. |
| 2005/0219727 A1 | 10/2005 | Kajiwara et al. |
| 2006/0198128 A1* | 9/2006 | Piepgras ................ F21V 31/04 362/147 |
| 2007/0004286 A1 | 1/2007 | Hobbel |
| 2008/0238411 A1 | 10/2008 | Kahlman et al. |
| 2008/0296478 A1* | 12/2008 | Hernoult .................. G01J 1/02 250/216 |
| 2010/0060275 A1 | 3/2010 | Veen et al. |
| 2010/0148765 A1 | 6/2010 | Nieuwenhuis et al. |
| 2010/0220823 A1 | 9/2010 | Biyani et al. |
| 2011/0121182 A1* | 5/2011 | Wong ...................... G01S 17/04 250/340 |
| 2012/0320532 A1 | 12/2012 | Wang |
| 2014/0112625 A1 | 4/2014 | Cole et al. |
| 2014/0113828 A1 | 4/2014 | Gilbert et al. |
| 2015/0057511 A1* | 2/2015 | Basu .................... A61B 5/6826 600/475 |
| 2016/0240721 A1* | 8/2016 | Chu ..................... G01J 1/0209 |
| 2017/0059563 A1 | 3/2017 | Smith et al. |
| 2018/0210086 A1 | 7/2018 | Seliuchenko et al. |
| 2018/0217170 A1 | 8/2018 | Ang et al. |
| 2018/0274946 A1 | 9/2018 | Maniouloux et al. |
| 2018/0274947 A1 | 9/2018 | Maniouloux et al. |
| 2018/0306846 A1 | 10/2018 | Lanzisera et al. |
| 2019/0212295 A1 | 7/2019 | Dehlinger et al. |
| 2019/0312652 A1 | 10/2019 | Shiraishi et al. |
| 2020/0080941 A1 | 3/2020 | Flanagan et al. |

OTHER PUBLICATIONS

Karipidis, Eleftherios, et al. "Crosstalk models for short VDSL2 lines from measured 30 MHz data." EURASIP Journal on Advances in Signal Processing 2006 (2006); Article ID 85859; https://link.springer.com/content/pdf/10.1155/ASP/2006/85859.pdf; pp. 1-9.

Moore Andrew C., et al. "Operation and test of hybridized silicon pin arrays using open-source array control hardware and software." Sensors and Camera Systems for Scientific, Industrial, and Digital Photography Applications IV, vol. 5017; International Society for Optics and Photonics (2003); http://astro.pas.rochester.edu/jetpac/IR-camera/papers/AMoore-SPIE-5017.pdf; pp. 1-14.

Vazquez, Josep Rius, et al. "Built-in current sensor for/spl Delta/l/sub DDQ/testing." IEEE Journal of Solid-State Circuits 39.3 (2004); https://pure.tue.nl/ws/portalfiles/portal/3373207; pp. 511-518.

Harmeling, Stefan, et al. "Analysing ICA components by injecting noise." Proceedings of the 4th International Symposium on Independent Component Analysis and Blind Signal Separation (ICA 2003); Nara, Japan. 2003; http://citeseerx.ist.psu.edu/viewdoc/download?doi=10.1.1.433.6574&rep=rep1&type=pdf; pp. 149-154.

Grandvalet, Yves. "Anisotropic noise injection for input variables relevance determination." IEEE Transactions on Neural Networks 11.6 (2000); https://booksc.xyz/book/31984769/2576f8; pp. 1201-1212.

Liu, Zhitao, et al; "New trends in nonlinear control systems and applications"; Hindawi Publishing Corporation Abstract and Applied Analysis; vol. 2015, Article ID 637632; (2015); pp. 1-2.

Porter, Michael, et al; "How smart connected products are transforming competition"; Harvard Business Review; Nov. 2014; whole document.

Training Manual; "Basic Linear Design"; Chapter 12; pp. 12-1 thru 12-95.

Mcgrath, Michael J., et al; "Sensor Technologies: Healthcare, Wellness and Environmental Applications"; Apress Open; whole document.

* cited by examiner

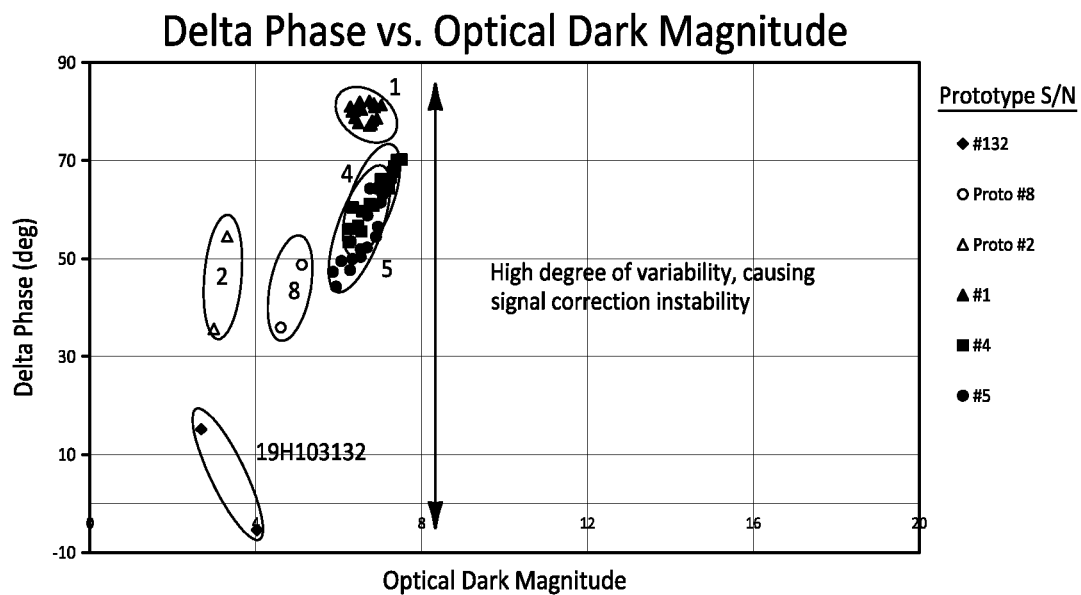
FIG. 1: Variability in the Delta Phase parameter results in signal correction instability.
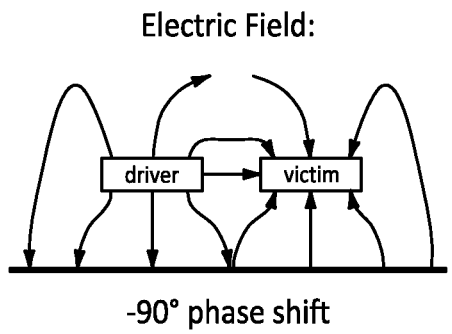
FIG. 2A
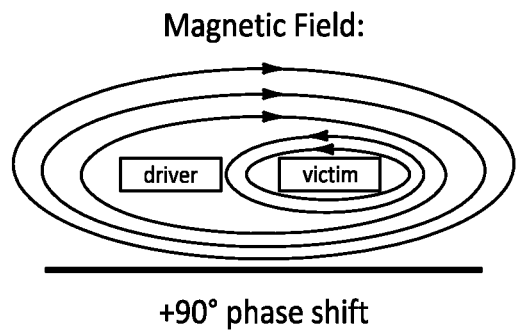
FIG. 2B
FIG. 2: illustration of the two primary forms of crosstalk -- capacitive and inductive

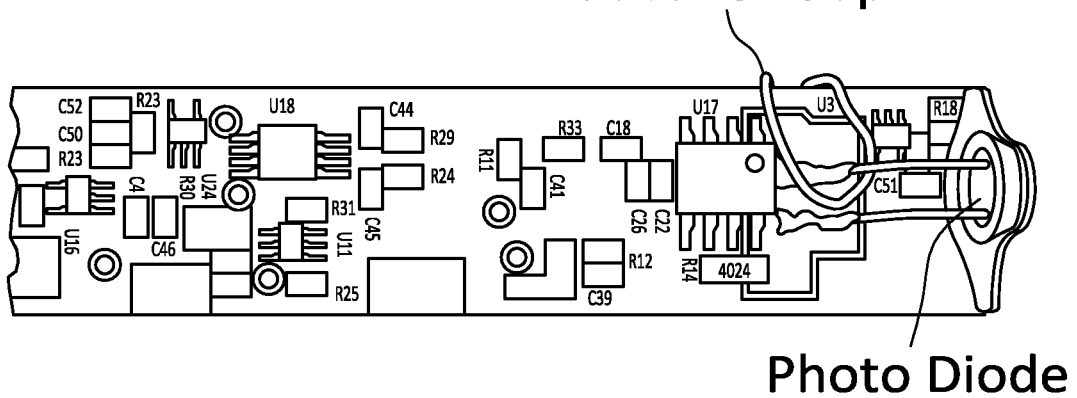
FIG. 3: Hand modification to PCB, introduced a single inductive loop
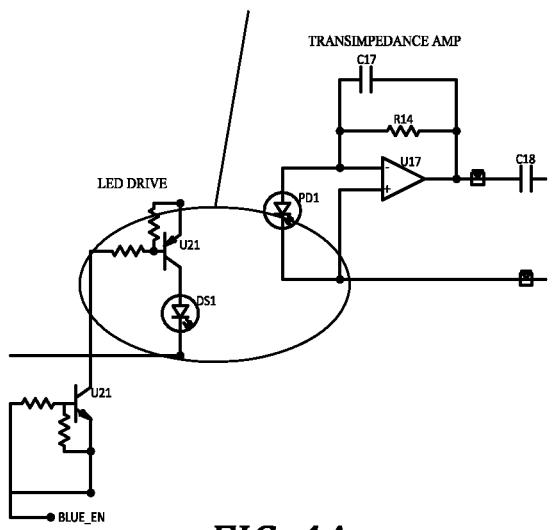
FIG. 4A
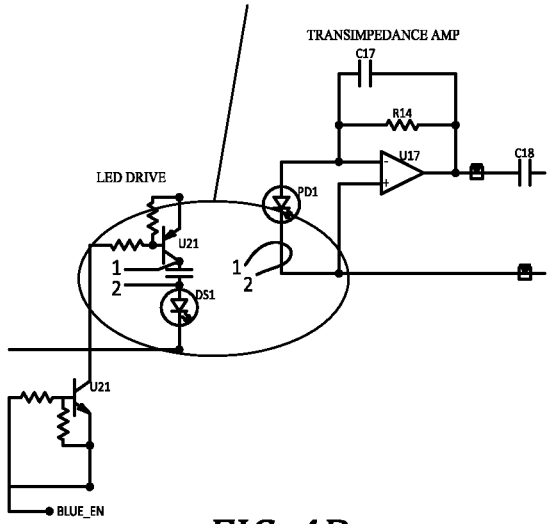
FIG. 4B
FIG. 4: Electrical schematic of deliberate introduction of a hand modified inductive loop

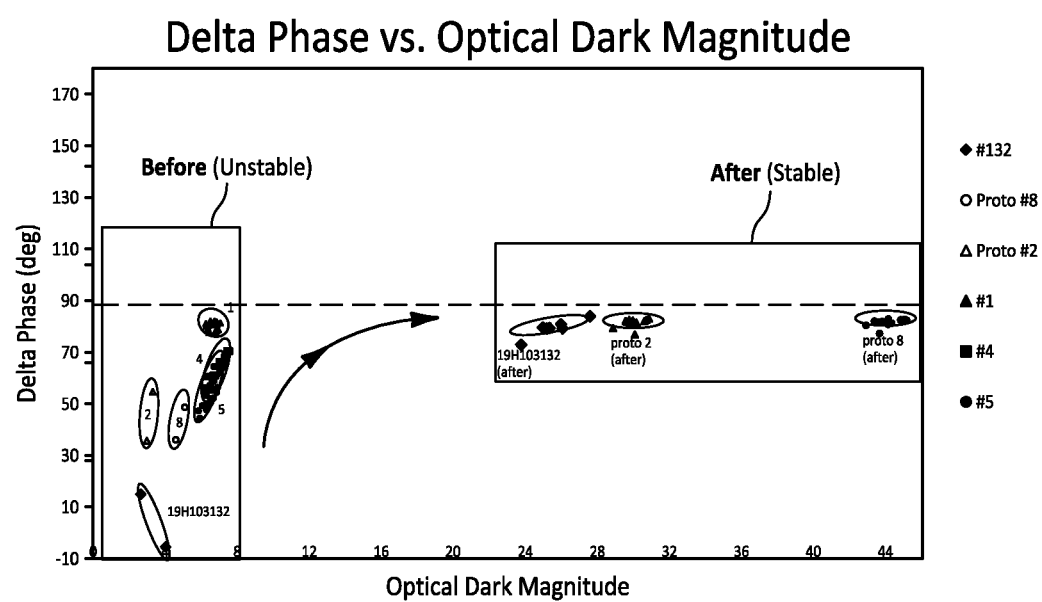
FIG. 5: Variability in sensor performance before vs after introduction of the inductive loop.

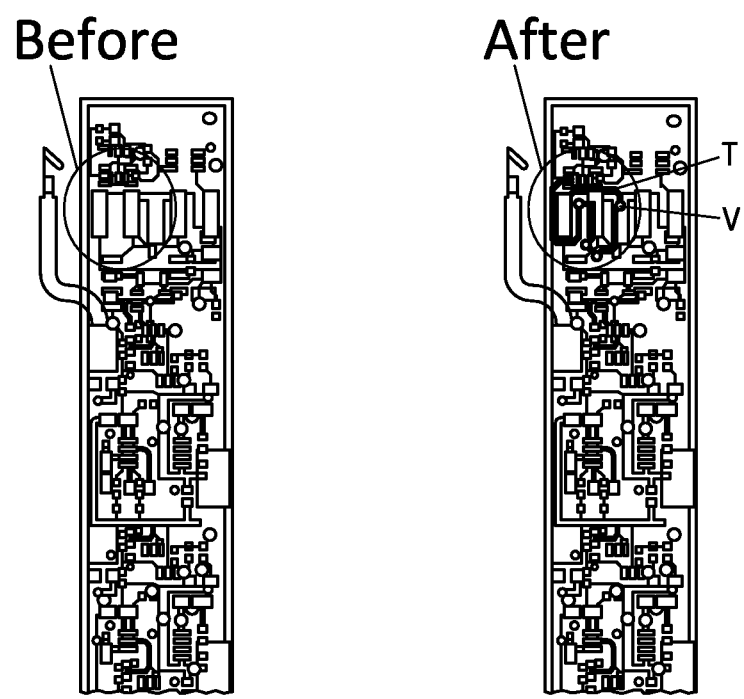
FIG. 6: PCB layout with deliberate 3/4 inductive loop

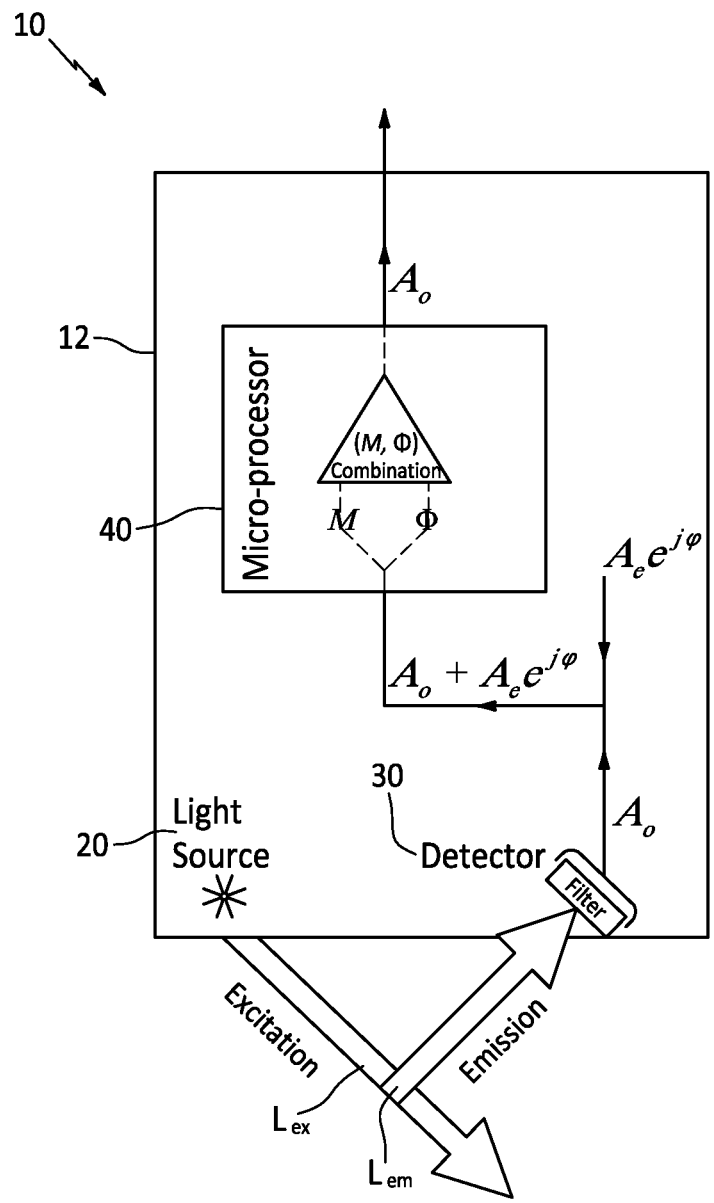
FIG. 7: Conceptual layout of a linearized detection scheme

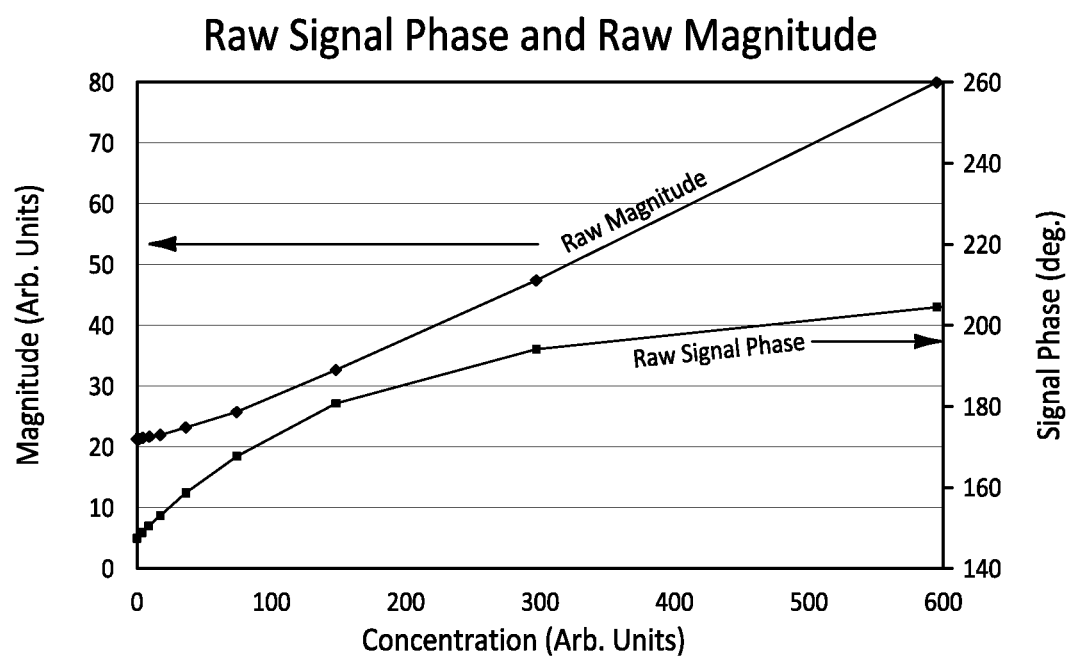
FIG. 8: Raw magnitude and signal amplitude used in the derived magnitude and phase combination

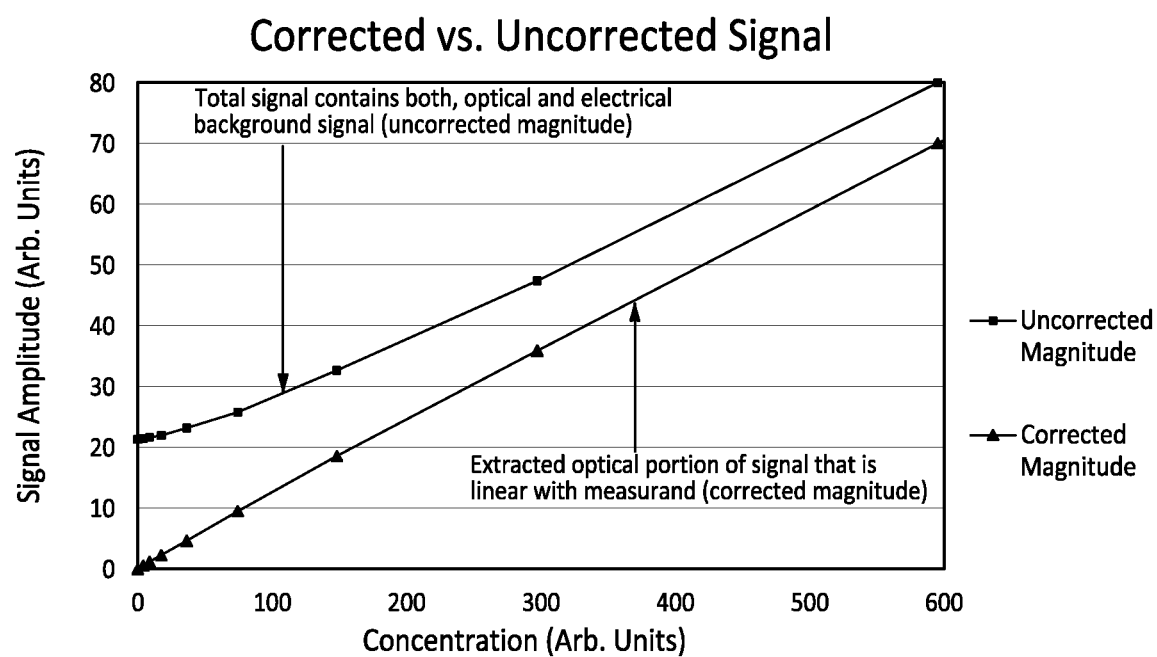
*FIG. 9*: Uncorrected vs. corrected electro-optical signal overlaid for comparison

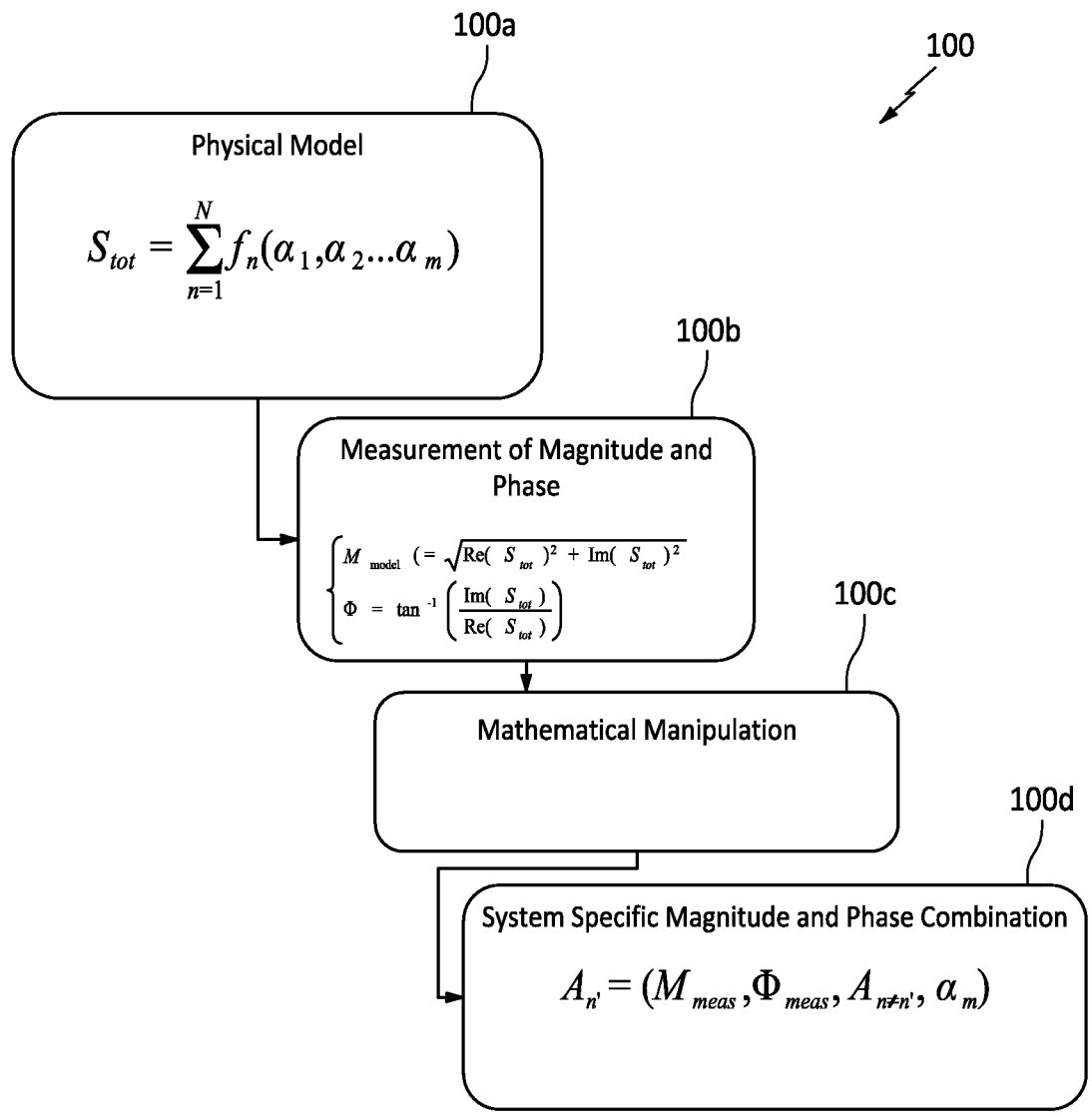
*FIG. 10*: Detailed description for determining unique magnitude and phase combinations

Apparatus, including a fluorometer 10 having an optical sensor 12, featuring:

A light source 20 configured to provide excitation light signaling Lex on a liquid having fluorescent-species of interest A detector 30 a printed circuit board (PCB) 32 having a photodiode cathode pad 34 with a photodiode 36 configured to receive optical emission signaling Lem emitted by the fluorescent-species of interest and provide electrical photodiode signaling having an electrical or photodiode current containing information about the fluorescent-species of interest in the liquid related to a liquid parameter of interest an inductive loop 38 arranged around at least part of the photodiode cathode pad, and configured to receive inductive loop inducing signaling, and provide inductive loop signaling around the at least part of the photodiode cathode pad to provide inductive crosstalk on the PCB to correct for non-linearity in the electrical photodiode signaling provided.

Signal processor or processing module 40 configured at least to:

receive and process the electrical photodiode signaling having an amplitude magnitude and phase components; and provide optical sensor signaling having a combined real-time magnitude and phase linearity correction, e.g., to reduce or substantially eliminate unwanted electrical interference.

Other signal processor circuits, circuitry, or components 50 that do not form part of the underlying invention, e.g., including input/output modules/modems, one or more memory modules (e.g., RAM, ROM, etc.), data, address and control busing architecture, etc.

*FIG. 11*

INDUCED CROSSTALK CIRCUIT FOR IMPROVED SENSOR LINEARITY

CROSS-REFERENCE TO RELATED APPLICATIONS

This application claims benefit to provisional patent application Ser. No. 63/135,799 (911-023.12-2/N-YSI-0050US01), filed 11 Jan. 2021, which is incorporated by reference in its entirety.

BACKGROUND OF THE INVENTION

1. Field of Invention

This invention relates to an optical sensor, such as a fluorometer; and more particularly, to an optical sensor having a printed circuit board (PCB) having a photodiode cathode pad with a photodiode.

2. Description of Related Art

In the prior art, environmental sensing is up against two conflicting industry trends:
1) state of the art sensor technologies are trending toward ever-smaller dimensions forcing undesirable affects such as electrical crosstalk, and
2) the demand in environmental sensing is requiring ever-increasing sensitivity thereby exacerbating the problems associated with crosstalk.

The consequence: Crosstalk is an inevitability despite diligent execution of best practices in a PCB layout.

Moreover, a high degree of variability regarding the magnitude and induced phase shift stemming from the crosstalk also exists in the known sensor technologies. Furthermore, the electrical crosstalk magnitude and phase shift are not perfectly fixed inalienable system constants impervious to the external environment, but instead demonstrate a non-negligible susceptibility to the electrical circuitry to which they interface. For the case at hand, a set of prototype sensors were each tested with multiple signal output adapters (SOAs) to check for variability. Such effects have undesirable consequences regarding the efficacy of the corrective signal processing. In particular, the signal phase, which serves as one of the signal processing inputs, is susceptible to phase noise, especially when attempting to resolve the phase of very low signal magnitudes as is often the case for electrical crosstalk signals. While a vanishingly small crosstalk signal would be acceptable (as this would indicate a negligible electrical crosstalk), however, it is more often the case that crosstalk signals are small enough in magnitude to be susceptible to phase noise, creating a noisy corrective input, but are still large enough to impede the required signal linearity. Finally, the variability in the induced phase shift also poses a problem. For the most stable corrective signal processing, a 90 degree phase is shift is optimal, but in practice the resulting phase shift as induced from the crosstalk can range anywhere from (−10 to +180) deg with magnitudes ranging from (0.1% to 20%) of available analog-to-digital converter range, e.g., consistent with that shown in FIG. 1, where multiple points for each of the six (6) prototypes shown represent the prototype's unique response to different signal output adapters.

In the plot in FIG. 1, the Delta Phase is the relative phase shift of the crosstalk signal with respect to the excitation LED signal and the Optical Dark Magnitude is the magnitude of the crosstalk signal without the presence of any optical signal. The corrective signal processing is impervious/invariant to variations in the optical dark magnitude (aside from the requirement that the optical dark magnitude be sufficiently large as to adequately resolve its phase). However, for the Delta Phase, this is not the case as any change in this parameter, once set as a calibration constant, will result in an error for the correction, e.g., consistent with that set forth herein.

SUMMARY OF THE INVENTION

By way of example, and according to some embodiments, the present application provides two new and unique inventions for implementing in a new and unique optical sensor, which address and solve the aforementioned problem in the prior art.

The first invention provides a new and unique corrective signal processing algorithm, e.g., known herein as an Optical Sensor with Signal Processing to Correct for Electrical Interference (Xylem no. N-YSI-0039), which combines real-time magnitude and phase information to achieve internal/self-linearity correction for optical sensing. Specifically, any unwanted electrical crosstalk, combined with the desired optical signal, results in a distortion on both the magnitude and phase information, causing signal nonlinearity. However, these distortions are complementary (i.e., meaning their relationships are interrelated), which allows the magnitude and phase information to be combined in a unique way to extract the desired pure optical signal, e.g., by also using the second invention consistent with that set forth herein.

Moreover, the second invention alleviates certain vulnerabilities presented in the corrective signal processing algorithm disclosed herein in relation to the first invention, e.g., by deliberately inducing a moderate inductive crosstalk with optimal phase shift at a specific location on the PCB (Xylem no. N-YSI-0050). By way of example, and according to some embodiments, the present invention introduces an inductive loop in relation to an electrical component on the PCB of the optical sensor, e.g., such as a photodiode cathode leg of a photodiode of the PCB.

It is noted that the corrective signal processing algorithm can be used with or without the inductive loop so long as the offending electrical crosstalk signal is of sufficient magnitude with a resolvable phase. However, the inductive loop does deliberately increase the crosstalk magnitude thereby allowing a more resolvable phase determination and with a "forced" optimal phase shift—i.e. the inductive loop enhances the efficacy of the corrective signal processing algorithm.

Specific Embodiments

According to some embodiments, the present invention may include, or take the form of, apparatus such as a fluorometer having an optical sensor with a detector including a printed circuit board (PCB) and an inductive loop.

By way of example, the PCB may include a photodiode cathode pad with a photodiode, and the inductive loop may be arranged around at least part of the photodiode cathode pad, and configured to receive inductive loop inducing signaling, and provide inductive loop signaling around the at least part of the photodiode cathode pad to provide inductive crosstalk on the PCB, together with the aforementioned corrective signal processing algorithm, to reduce or substantially eliminate unwanted electrical interference in electrical photodiode signaling provided from the photodiode.

The apparatus may include one or more of the following additional features:

The inductive loop may include a trace having a route along a signal path from a transistor collector pin around an LED anode pad; and at least one via placed between LED anode pads to route the trace on a top side of the PCB, the trace being routed alongside, near and around the photodiode cathode pad back to the LED anode of the LED anode pad.

The at least one via may include other vias placed along the route around the photodiode cathode pad configured to jump over other 2.5V bias connections made to other components on the PCB.

The inductive loop may be a ¾ inductive loop around the photodiode cathode pad.

The apparatus may include, or take the form of, a fluorescence-based optical sensor or fluorometer configured to provide an optical-based water quality sensor.

The photodiode may be configured to receive optical emission signaling $L_{em}$ emitted by one or more fluorescent-species of interest and provide electrical photodiode signaling having an electrical or photodiode current containing information about the one or more fluorescent-species of interest in the liquid related to a liquid parameter of interest.

The optical sensor may include a signal processor or processing module for implementing a corrective signal processing algorithm, e.g., that is configured at least to:

receive and process the electrical photodiode signaling having amplitude magnitude and phase components; and provide optical sensor signaling having a combined real-time magnitude and phase linearity correction, e.g., to reduce or substantially eliminate unwanted electrical interference in the electrical photodiode signaling.

The electrical photodiode signaling may take the form of a total measured signal $S_{tot}$ that is the sum of a first contribution $A_o$ plus a second contribution $A_e e^{j\varphi}$, where the first contribution $A_o$ is optical in origin having a first signal amplitude, $A_o$, and is independently known to have a purely linear response to the concentration of the fluorescent-species in the liquid, and the second contribution $A_e e^{j\varphi}$ is an electrical interference signal having a second signal amplitude, $A_e$, is constant and independent of the measurand and has an overall constant phase shift, $\varphi$, with respect to the first contribution.

The signal processor or processing module may be configured at least to:

identify real and imaginary components of the total signal $S_{tot}$ to yield:

$$\begin{cases} Re(S_{tot}) = A_o + A_e\cos(\varphi) \\ Im(S_{tot}) = A_e\sin(\varphi) \end{cases} ; \quad \text{Equation 2}$$

and construct the magnitude, M, and the phase, $\phi$, by substituting the real and imaginary components, as follows:

$$\begin{cases} M = \sqrt{Re(S_{tot})^2 + Im(S_{tot})^2} \\ \Phi = \tan^{-1}\left(\frac{Im(S_{tot})}{Re(S_{tot})}\right) \end{cases} . \quad \text{Equation 3}$$

The signal processor or processing module is configured at least to:

determine $A_o$ by eliminating the second signal amplitude $A_e$, as follows:

$$A_o = \sqrt{\frac{M^2(2\sin\varphi\tan\Phi\cos\varphi + (\tan\Phi\sin\phi)^2 - (\sin\varphi)^2 + 1)(\sin\varphi - \tan\Phi\cos\varphi)^2}{(\sin\varphi)^2((\tan\Phi)^2 + 1)(\cos\varphi + \tan\Phi\sin\varphi)^2}} \quad \text{Equation 4}$$

so as to provide an algebraically-derived expression for $A_o$, the portion of the signal that has a purely linear response to the concentration of the fluorescent-species as predicted optically.

Alternative Embodiment

According to some embodiments, the present invention may also take the form of an optical sensor having a detector having a printed circuit board (PCB) and a signal processor or processing module.

The printed circuit board (PCB) may include a photodiode cathode pad with a photodiode to receive optical emission signaling $L_{em}$ emitted by the fluorescent-species of interest and provide electrical photodiode signaling having an electrical or photodiode current containing information about the fluorescent-species of interest in the liquid related to a liquid parameter of interest.

The signal processor or processing module may be configured at least to:

receive and process the electrical photodiode signaling having an amplitude magnitude and phase components; and provide optical sensor signaling having a combined real-time magnitude and phase linearity correction.

The optical sensor may also include one or more of the features set forth above and herein.

The Method

According to some embodiments, and by way of further example, the present invention may include a method featuring steps for:

configuring an optical sensor with a detector having a printed circuit board (PCB) that has a photodiode with a photodiode cathode pad;

arranging an inductive loop around at least part of the photodiode cathode pad;

receiving inductive loop inducing signaling in the inductive loop; and providing inductive loop signaling around the at least part of the photodiode cathode pad to provide inductive crosstalk on the PCB, together with the aforementioned corrective signal processing algorithm, to reduce or substantially eliminate unwanted electrical interference in electrical photodiode signaling provided from the photodiode.

The method may also include one or more of the features set forth above.

Computer-Readable Storage Medium

According to some embodiments, and by way of further example, the present invention may also take the form of a computer-readable storage medium having computer-executable components for performing the steps of the aforementioned method. The computer-readable storage medium may also include one or more of the features set forth above.

Further Alternative Embodiment

According to some embodiments, and by way of further example, the present invention may include, or take the form of, an optical sensor having a printed circuit board (PCB) and an inductive loop.

The printed circuit board (PCB) may include an optical-electrical component configured to sense an optical signal and provide electrical signaling containing information about the optical signal sensed.

The inductive loop may be arranged around at least part of the optical-electrical component, and configured to receive inductive loop inducing signaling, and provide inductive loop signaling around the at least part of the optical-electrical component to provide inductive crosstalk on the PCB, together with the aforementioned corrective signal processing algorithm, to reduce or substantially eliminate unwanted electrical interference in electrical signaling provided from the optical-electrical component.

By way of example, the optical-electrical component may include a photodiode cathode pad with a photodiode; and the inductive loop is arranged around at least part of the photodiode cathode pad.

BRIEF DESCRIPTION OF THE DRAWING

The drawing, which are not necessarily drawn to scale, includes FIGS. 1-11, as follows:

FIG. 1 is a graph of Delta Phase (degrees) v. Optical Dark Magnitude and shows a variability in the Delta Phase parameter that results in signal correction instability.

FIG. 2 includes FIG. 2A and FIG. 2B, which shows illustrations of two primary forms of crosstalk—capacitive and inductive.

FIG. 3 is a photograph of a PCB having a hand modification to the PCB, e.g., which introduces a single inductive loop according to the present invention.

FIG. 4 includes FIGS. 4A (before) and 4B (after), e.g., showing electrical schematic of a deliberate introduction of a hand-modified inductive loop according to the present invention.

FIG. 5 is a graph of Delta Phase (degrees) v. Optical Dark Magnitude and shows a variability in sensor performance before vs after the introduction of the inductive loop in FIG. 3.

FIG. 6 includes FIGS. 6A and 6B that show before and after PCB layouts with the introduction of a deliberate 3/4 inductive loop in FIG. 6B according to the present invention.

FIG. 7 is a diagram showing a conceptual layout of a linearized detection scheme, e.g., according to some embodiments of the present invention.

FIG. 8 is a graph of magnitude and signal phase v. concentration showing plots of raw magnitude and signal phase used in a derived magnitude and phase combination, e.g., according to some embodiments of the present invention.

FIG. 9 is a graph of corrected and uncorrected signal v. concentration showing plots of uncorrected vs. corrected electro-optical signal overlaid for comparison, where the total signal contains both an optical and electrical background signal (uncorrected magnitude), and where an extracted optical portion of a signal that is linear with measurand (corrected magnitude).

FIG. 10 is a flowchart showing a detailed description for determining unique magnitude and phase combinations, e. g. including a physical model, a measurement of magnitude and phase, a mathematical manipulation, and a system specific magnitude and phase combination.

FIG. 11 is a block diagram of apparatus, e.g., including a fluorometer meter having an optical sensor with a detector, according to some embodiments of the present invention.

To reduce clutter in the drawing, each Figure in the drawing does not necessarily include every reference label for every element shown therein.

DETAILED DESCRIPTION OF BEST MODE OF THE INVENTION

Summary of the Basic Invention

In summary, the present invention alleviates the vulnerabilities presented in the corrective signal processing algorithm by deliberately inducing a moderate inductive crosstalk with optimal phase shift at a specific location on the PCB. For example, if the crosstalk signal is sufficiently large (but not too large) in magnitude (approximately 2-5% of available analog-to-digital converter range), then the respective signal phase will be well-resolved and provide a stable input into the corrective signal processing. The question becomes: Where is the ideal location for deliberately induced crosstalk? By way of example, and according to some embodiments, the present invention provides the photodiode as an ideal location for deliberately induced crosstalk, since it is the most critical component in the receive side of the circuit (receive side—meaning any and all circuitry dedicated to receiving and propagating the electro-optical signal). The photodiode receives optical light and returns an electrical current referred to as a photocurrent. Any crosstalk located at either the photodiode or further down the signal chain in the receiving electronics will result in signal nonlinearity. The next question becomes: What type of crosstalk should be deliberately employed? For example, crosstalk can manifest in two primary forms: 1) Capacitive crosstalk which is mediated by the electric field, and 2) Inductive crosstalk, mediated by the magnetic field, e.g., as shown in FIG. 2. In the parlance of electrical crosstalk, the "driver" is the electrical line that initiates the crosstalk, and the "victim" is the line or component that is susceptible to the crosstalk initiated.

For a proof-of-concept, a single inductive loop was introduced by lifting the cathode leg of the LED and soldering in its place an electrical jumper in series that makes a single loop around the photodiode cathode leg before terminating on the LED cathode pad. By way of example, and according to some embodiments, the present invention is based upon providing inductive crosstalk, since it is relatively straight-forward to implement in a practical application (i.e., easy to perform hand modification) and provides a +90 deg phase shift which is optimal (see FIG. 3).

With the introduction of the inductive loop, the Delta Phase demonstrates a greatly enhanced stability as the Delta Phase parameter is very close to the optimal 90 deg and displays minimal variation with multiple signal output adapters. As intended, the Optical Dark Magnitude(s) fall approximately within the desired 2-5% of available analog-to-digital converter range, and although there is variation in this parameter over multiple SOA(s), this is of little consequence since this parameter, Optical Dark Magnitude, has no specific dependence in the corrective signal processing.

Consistent with that set forth in further detail below, the present invention also provides and takes advantage of a corrective signal processing algorithm, entitled "Optical Sensor with Signal Processing to Correct for Electrical Interference," e.g., based upon using equation (4):

$$A_o = \sqrt{\frac{M^2(2\sin\varphi\tan\theta\cos\varphi + (\tan\theta\sin\varphi)^2 - (\sin\varphi)^2 + 1)(\sin\varphi - \tan\theta\cos\varphi)^2}{(\sin\varphi)^2((\tan\theta)^2 + 1)(\cos\varphi + \tan\theta\sin\varphi)^2}}$$

Equation 4)

where $A_o$ is the linear (optical) portion of the signal
φ≡(Delta Phase), is a system constant
θ≡signal phase, a real-time, measured input
M≡signal magnitude, also a real-time, measured input
$A_e$≡(Optical Dark Magnitude) does not appear in the corrective signal processing Key Element The key element to one aspect of the present invention is the deliberate introduction of the inductive loop, e.g., passing around the photodiode cathode leg of the photodiode. By way of example, FIG. 6B illustrates a PCB layout as one possible embodiment of the inductive loop. Such a layout would provide a consistent inductive loop (as opposed to a hand-modified loop shown in FIG. 3).

For example, the PCB modification can be realized through a deliberate PCB layout by routing a trace T from the PNP transistor collector pin (U21 in the schematic (FIG. 4)) around the LED anode pad (DS1 in the schematic (FIG. 4)), and placing a via (e.g., vias are electrical connections between board layers) between the DS1 pads to route on the top side of the PCB. From there, the trace T can be routed alongside the photodiode cathode pad (PD1 in schematic (FIG. 4)) as close as possible. Vias to be placed along the route around the photodiode cathode pad to jump over other 2.5V bias connections made to other components. In total, a ¾ inductive loop around the PD1 cathode pad can be completed before finally connecting the signal path back to the LED anode of the DS1 pad.

The Corrective Signal Processing Algorithm to Correct for Electrical Interference in an Optical Sensor Another Problem to be Solved by the Present Invention Physical systems are most generally non-linear in nature, i.e., the output, or response of the system is generally not simply proportional to the stimulus, or input, as is often desirable. (See Liu Z, Huang D, Xing Y, Zhang C, Wu Z, Ji X., entitled "New trends in nonlinear control systems and applications," Abstr Appl Anal. 2015; 2015:2.) In order to accommodate real systems, the trend in sensing technologies is broadening its scope. Instead of performing just one type of measurement for one physical parameter, advances are being made which measure and utilize any and all available physical information to make informed decisions. (e.g., see https://hbr.org/2014/11/how-smart-connected-products-are-transforming-competition.) This disclosure epitomizes the spirit conveyed in the preceding statement.

The general subject of nonlinear physical systems is too broad to convey the virtue of the present invention, which focuses on the relevant class of physical systems concerning optical-based water quality sensing. Optical-based water quality sensors operate on the principle that can most generally be described as the conversion of light/matter interaction into an electrical signal, usually consisting of either an electrical current or voltage. State of the art sensor technologies rely on electrical circuits that are trending toward ever smaller dimensions which requires that electrically susceptible components (e.g., sensitive receiver electronics) are necessarily placed in close proximity to electrically noisy components creating unwanted electrical interference (or crosstalk). (e.g., see http://www.analog-.com/media/en/training-seminars/design-handbooks/Basic-Linear-Design/Chapter12.pdf.) Despite diligent execution of best practices in modern electrical design, optical sensing techniques are still susceptible to electrical interferences resulting in signal nonlinearity. At the same time, the demand in environmental sensing is requiring ever-increasing sensitivity, thereby exacerbating the problems associated with nonlinearity. (e.g., see Sensor Technologies: Healthcare, Wellness and Environmental Applications Paperback by Michael J. McGrath, Cliodhna Ni Scanaill, Dawn Nafus.) Electrical signals (current or voltage) possess both, magnitude (generalized amplitude) and phase (particular point or stage in the advancement of a cycle). The unwanted electrical interference, combined with the desired optical signal, induces distortion on both the magnitude and phase information. However, these distortions are complementary which, in turn, allows the magnitude and phase information to be combined in a unique way to extract the desired linear portion of the signal. While current art is capable of simultaneous measurement of magnitude and phase, existing sensors typically utilize either the magnitude or the phase, but not both. Furthermore, there is no prior art—that the inventor(s) is aware of—associated with employing combined use of both magnitude and signal phase to achieve linearity correction.

The Solution to the Problem

Another aspect of the present invention enables internal/self-linearity correction for fluorescence-based sensors exhibiting a non-linear response by uniquely combining real-time magnitude and phase information, e.g., by implementing the corrective signal processing algorithm set forth below. To determine the system-specific magnitude and phase information, the present invention employs physics-based modeling as a guide. Modeling establishes the correct mathematical arrangement of signal contributions, and once determined, the desired linear contribution from the total signal can be extracted (i.e., solved for) mathematically thereby generating the correct combination (or formula) of magnitude and phase required to achieve linearity.

Fluorescence-based sensing uses a light source (e.g., at a specified optical wavelength) to optically excite the fluorescence species of interest that re-emits optical light (e.g., at a longer optical wavelength) specific to the water parameter of interest. For the physical system composed of fluorometer and electrical interference, the total measured signal, $S_{tot}$, can be modeled as the sum of all known signal contributions. The first contribution is optical in origin whose signal amplitude, $A_o$, is independently known (a priori) to have a purely linear response to the concentration of the fluorescence species. The second contribution is an electrical interference signal whose amplitude, $A_e$, is constant and independent of the measurand and is also known (a priori) to have an overall constant phase shift, φ, with respect to the optical contribution. FIG. 7 shows a conceptual layout of the linear extraction scheme. These signals can be represented mathematically as:

$$S_{tot} = A_o + A_e e^{j\Omega\varphi}$$ Equation 1

Identifying real and imaginary components of the total signal $S_{tot}$ yields:

$$\begin{cases} Re(S_{tot}) = A_o + A_e \cos(\varphi) \\ Im(S_{tot}) = A_e \sin(\varphi) \end{cases}$$ Equation 2

Magnitude, M, and phase, ϕ, are constructed as follows:

$$\begin{cases} M = \sqrt{Re(S_{tot})^2 + Im(S_{tot})^2} \\ \Phi = \tan^{-1}\left(\frac{Im(S_{tot})}{Re(S_{tot})}\right) \end{cases}$$ Equation 3

The explicit forms of the real and imaginary components from equation 2) can be substituted into Equation 3, where the optical amplitude, $A_o$, can be solved for algebraically as shown in Equation 4 below. The corollary for this particular example is that the amplitude of the electrical background, $A_e$, can be algebraically factored out/eliminated and does not appear in the final expression.

$$A_o = \sqrt{\frac{M^2(2\sin\varphi\tan\Phi\cos\varphi + (\tan\Phi\sin\phi)^2 - (\sin\varphi)^2 + 1)(\sin\varphi - \tan\Phi\cos\varphi)^2}{(\sin\varphi)^2((\tan\Phi)^2 + 1)(\cos\varphi + \tan\Phi\sin\varphi)^2}}$$ Equation 4

Equation 4 is an algebraically-derived expression for $A_o$, the portion of the signal that has a purely linear response to the concentration of the fluorescence species as predicted optically. Note, Equation 4 is dependent only on the measured signal magnitude, M, measured signal phase, ϕ, and relative phase offset φ, which is a measurable constant and can be stored into a system calibration. Note that the particular functional form of Equation 4 is unique to the specific physical system described above. A detailed description for determining unique magnitude and phase combinations using the corrective signal processing algorithm is further described in relation to FIG. 10.

The data presented below in FIGS. 8 and 9 represents a real-world, specific implementation of the present invention applied to a fluorescence-based sensor. For this data, serial dilutions were performed to change the concentration of the chosen fluorescence species, where the magnitude and phase response were recorded at each concentration. FIG. 8 shows and reveals the raw magnitude and signal amplitude that were inputted into the derived magnitude and phase combination, and FIG. 9 shows and reveals the uncorrected vs. corrected electro-optical signal overlaid for comparison.

Regarding the sensor layout in general: The sensor according to the present invention differs from traditional fluorometers primarily in the details concerning the electrical signal chain and the specific operations applied to the measured magnitude and signal phase. The spirit of this invention is not restricted to any specific hardware to perform measurement of magnitude and signal phase, nor is it intended to be restrictive to any specific type of signal interference (in this example an electrical interference is identified). Furthermore, the present invention is not intended to be restrictive to any specific hardware (e.g., either a micro-processor or a field programmable gate array (FPGA) could be used) to perform the required operations necessary to realize the uniquely determined magnitude and phase combination.

FIG. 10

FIG. 10 shows a flowchart 100 having steps 100a, 100b, 100c and 100d for determining unique magnitude and phase combinations using the corrective signal processing algorithm, e. g. showing a physical model 100a, a measurement of magnitude and phase 100b, a mathematical manipulation 100c, and a system specific magnitude and phase combination 100d.

In the physical model step 100a, e.g., $f_n$ is the $n_{th}$ signal contribution and $\alpha_m$ is the $m_{th}$ independent parameter. Independent parameters include, but not limited to: amplitude, time, frequency, initial and constant phase shifts, measured concentration etc. Note, the model-based approach may predict a functional form other than a simple summation of signal contributions. For example, the model may predict a product series of functions or some other form, dependent on the specific physical system at hand. Further note, the quality of the extracted linear signal may only be as good or valid as the physical model used to derive the magnitude and phase combination. Any unaccounted contributions to the signal may introduce error in the final extracted value.

In the measurement of magnitude and phase step 100b, e.g., the spirit of the present invention is not restricted to any specific hardware to perform measurement of the signal magnitude or signal phase.

In the mathematical manipulation step 100c, e.g., for the example listed herein, only straight forward algebra is needed to isolate the desired variable. The spirit of the present invention is not intended to be restrictive to the use of any specific mathematical tool needed to extract linear components from otherwise non-linear signals. In general, techniques involving Calculus, Fourier Analysis, Linear Algebra, Correlation or Convolutions, or any other mathematical tools might be used as needed to isolate the desired parameter.

In the system specific magnitude and phase combination step 100d, e.g., the final expression for the desired combination may necessarily have the following characteristics: The desired variable must ultimately be expressible in terms of measured magnitude, M and measured signal phase ϕ in addition to any identified system constants amenable to system calibration. Important note: Not all physical systems are necessarily soluble. Furthermore, not all soluble systems are expressible in analytic form. In such cases, it may be necessary, for example, to express solutions in terms of series expansions or product expansions to desired order. Important corollary: The disclosed method further permits extraction of components other than linear contributions for example, to identify the offending interference contribution.

FIG. 11

FIG. 11 shows apparatus, including a fluorescence-based sensor or fluorometer 10 having an optical sensor 12, that features a light source 20, a detector 30 and a signal processor or processing module 40.

The light source 20 may be configured to provide excitation light signaling Lex on a liquid having the one or more fluorescent-species of interest.

The detector 30 has a printed circuit board (PCB) 32 and an inductive loop 38. The PCB 32 has a photodiode cathode pad 34 with a photodiode 36 configured to receive optical emission signaling $L_{em}$ emitted by the fluorescent-species of interest and provide electrical photodiode signaling having an electrical or photodiode current containing information about the fluorescent-species of interest in the liquid related to a liquid parameter of interest. The inductive loop 38 is arranged around at least part of the photodiode cathode pad, and configured to receive inductive loop inducing signaling, and provide inductive loop signaling around the at least part of the photodiode cathode pad to provide inductive crosstalk on the PCB to correct for non-linearity in the electrical photodiode signaling provided.

The signal processor or processing module 40 is configured at least to:
  receive and process the electrical photodiode signaling having an amplitude magnitude and phase components; and
  provide optical sensor signaling having a combined real-time magnitude and phase linearity correction to reduce or substantially eliminate unwanted electrical interference.

The signal processor or processing module 40 includes other signal processor circuits, circuitry, or components 50 that do not form part of the underlying invention, e.g., including input/output modules/modems, one or more memory modules (e.g., RAM, ROM, etc.), data, address and control busing architecture, etc.

Implementation of Signal Processing Functionality

By way of example, the functionality of the signal processor or processing module 40 may be implemented using hardware, software, firmware, or a combination thereof. In a typical software implementation, the signal processor 40 would include one or more microprocessor-based architectures having, e. g., at least one signal processor or microprocessor. One skilled in the art would be able to program with suitable program code such a microcontroller-based, or microprocessor-based, implementation to perform the signal processing functionality disclosed herein without undue experimentation.

The scope of the invention is not intended to be limited to any particular implementation using technology either now known or later developed in the future. The scope of the invention is intended to include implementing the functionality of the signal processor(s) as stand-alone processor, signal processor, or signal processor module, as well as separate processor or processor modules, as well as some combination thereof.

By way of example, the apparatus 10 may also include, e.g., other signal processor circuits or components generally indicated as 50, including random access memory or memory module (RAM) and/or read only memory (ROM), input/output devices and control, and data and address buses connecting the same, and/or at least one input processor and at least one output processor, e.g., which would be appreciate by one skilled in the art.

By way of further example, the signal processor 40 may include, or take the form of, some combination of a signal processor and at least one memory including a computer program code, where the signal processor and at least one memory are configured to cause the system to implement the functionality of the present invention, e.g., to respond to signaling received and to determine the corresponding signaling, based upon the signaling received.

RELATED PATENTS

The inventor(s) is aware of at least the following related patent documents, as follows:
US 2005/0219727 A1, entitled "Signal processing device and signal processing method."
U.S. Pat. No. 6,911,925 B1, entitled "Linearity compensation by harmonic cancellation."
U.S. Pat. No. 4,968,968 A, entitled "Transmitter phase and amplitude correction for linear FM systems."
U.S. Pat. No. 6,853,191 B1, entitled "Method of removing dynamic nonlinear phase errors from MRI data."

There appear to be several patents concerning nonlinearity corrections regarding magnitude and phase, but no patent document that discloses the present invention that the inventor(s) is aware of.

A summary of the major findings is presented below:
The patent literature discloses distortion correction or nonlinearity correction applied to the magnitude and phase information, but no reference of using the signal phase to correct for nonlinearities in the magnitude. This is a critical difference between the present invention and that known in the prior art patent documents.
The patent literature primarily discloses apparatus, or circuit designs involving electrical filters to perform corrections, not any complementary use of measured magnitude and measured signal phase to perform corrections.
The patent literature discloses specific nonlinearities concerning magnetic and or optical recording, correcting errors in radar systems employing FM signals, or nonlinearities regarding medical or MRI imaging.

The Light Source 20

By way of example, the apparatus 10 may include the light source 20 configured to provide the light $L_{em}$ (FIG. 8) through the liquid sample arranged in relation to the light source 20 and the detector 30 so as to reflect the light off the fluorescent-species of interest being monitored or tested.

As a person skilled in the art would appreciate, light sources are known in the art, and the scope of the invention is not intended to be limited to any particular type or kind thereof either now known or later developed in the future.

Photodiode Detectors and/or Sensors

Regarding sensor hardware, the photodiode detector or sensor contains elements which are known in the prior art. By way of example, the sensor hardware may contain single or multiple LEDs at specified excitation wavelengths, suitable to the fluorophore species of interest, and one or more optical receivers (photodetectors or optical spectrum analyzers) employing one or multiple optical bandpass filters, spectrally centered at the specified excitation and or emission wavelengths.

As a person skilled in the art would appreciate, sensor hardware is known in the art, and the scope of the invention is not intended to be limited to any particular type or kind thereof either now known or later developed in the future.

Fluorophores

As a person skilled in the art would appreciate, a fluorophore is a fluorescent chemical compound that can re-emit light upon excitation. Fluorophores typically contain several combined aromatic groups, or planar or cyclic molecules with π bonds.

By way of example, fluorophores are sometimes used as a tracer in fluids, as a dye for staining of certain structures, as a substrate of enzymes, or as a probe or indicator (when fluorescence is affected by environmental aspects such as polarity or ions).

The scope of the invention is not intended to be limited to any particular type or kind of fluorophore either now known or later developed in the future.

Applications

The present invention has applications, e.g., in the basic parameter of water quality monitoring for environmental waters in general which include freshwater, salt water/brackish, as well as drinking water monitoring applications.

THE SCOPE OF THE INVENTION

While the invention has been described with reference to exemplary embodiments, it will be understood by those skilled in the art that various changes may be made, and equivalents may be substituted for elements thereof without departing from the scope of the invention. In addition, modifications may be made to adapt a particular situation or material to the teachings of the invention without departing from the essential scope thereof. Therefore, the present invention is not intended be limited to any particular embodiment(s) disclosed herein as the best mode contemplated for carrying out this invention.

What is claimed is:

1. An optical sensor having a detector comprising:
a printed circuit board (PCB) having a photodiode cathode pad with a photodiode; and
an inductive loop arranged around at least part of the photodiode cathode pad, and configured to receive inductive loop inducing signaling, and provide inductive loop signaling around the at least part of the photodiode cathode pad to provide inductive crosstalk on the PCB to reduce or substantially eliminate unwanted electrical interference in electrical photodiode signaling provided from the photodiode.

2. An optical sensor according to claim 1, wherein the inductive loop comprises:
a trace having a route along a signal path from a transistor collector pin around an LED anode pad; and
at least one via placed between LED anode pads to route the trace on a top side of the PCB, the trace being routed alongside, near and around the photodiode cathode pad back to the LED anode of the LED anode pad.

3. An optical sensor according to claim 2, wherein the at least one via comprises other vias placed along the route around the photodiode cathode pad configured to jump over other 2.5V bias connections made to other components on the PCB.

4. An optical sensor according to claim 3, wherein the inductive loop is a ¾ inductive loop around the photodiode cathode pad.

5. An optical according to claim 1, wherein the photodiode is configured to receive optical emission signaling $L_{em}$ emitted by one or more fluorescent-species of interest and provide the electrical photodiode signaling having an electrical or photodiode current containing information about the one or more fluorescent-species of interest in the liquid related to a liquid parameter of interest.

6. An optical sensor according to claim 5, wherein the optical sensor comprises a signal processor or processing module for implementing a corrective signal processing algorithm that is configured at least to:
receive and process the electrical photodiode signaling having amplitude magnitude and phase components; and
provide optical sensor signaling having a combined real-time magnitude and phase linearity correction.

7. An optical sensor according to claim 6, wherein
the electrical photodiode signaling takes the form of a total measured signal $S_{tot}$ that is the sum of a first contribution $A_o$ plus a second contribution $A_e e^{j\varphi}$, where the first contribution $A_o$ is optical in origin having a first signal amplitude, $A_o$, and is independently known to have a purely linear response to the concentration of the fluorescent-species in the liquid, and the second contribution $A_e e^{j\varphi}$ is an electrical interference signal having a second signal amplitude, $A_e$, is constant and independent of the measurand and has an overall constant phase shift, $\varphi$, with respect to the first contribution.

8. An optical sensor according to claim 7, wherein the signal processor or processing module is configured at least to:
identify real and imaginary components of the total signal $S_{tot}$ to yield:

$$\begin{cases} Re(S_{tot}) = A_o + A_e \cos(\varphi) \\ Im(S_{tot}) = A_e \sin(\varphi) \end{cases} ; \qquad \text{Equation 2)}$$

and
construct the magnitude, M, and the phase, (I), by substituting the real and imaginary components, as follows:

$$\begin{cases} M = \sqrt{Re(S_{tot})^2 + Im(S_{tot})^2} \\ \Phi = \tan^{-1}\left(\frac{Im(S_{tot})}{Re(S_{tot})}\right) \end{cases} \qquad \text{Equation 3)}$$

9. An optical sensor according to claim 8, wherein the signal processor or processing module is configured at least to:
determine $A_o$ by eliminating the second signal amplitude $A_e$, as follows:

$$A_o = \sqrt{\frac{M^2(2\sin\varphi\tan\Phi\cos\varphi + (\tan\Phi\sin\phi)^2 - (\sin\varphi)^2 + 1)(\sin\varphi - \tan\Phi\cos\varphi)^2}{(\sin\varphi)^2((\tan\Phi)^2 + 1)(\cos\varphi + \tan\Phi\sin\varphi)^2}} \qquad \text{Equation 4)}$$

so as to provide an algebraically derived expression for $A_o$, the portion of the signal that has purely linear response to the concentration of the fluorescent-species as predicted optically.

10. An optical sensor having a detector comprising:
a printed circuit board (PCB) having a photodiode cathode pad with a photodiode to receive optical emission signaling $L_{em}$ emitted by the fluorescent-species of interest and provide electrical photodiode signaling having an electrical or photodiode current containing information about the fluorescent-species of interest in the liquid related to a liquid parameter of interest; and a signal processor or processing module for implementing a corrective signal processing algorithm that is configured at least to:
- receive and process the electrical photodiode signaling having an amplitude magnitude and phase components; and
- provide optical sensor signaling having a combined real-time magnitude and phase linearity correction.

11. An optical sensor according to claim 10, wherein the electrical photodiode signaling takes the form of a total measured signal $S_{tot}$ that is the sum of a first contribution $A_o$ plus a second contribution $A_e e^{j\varphi}$, where the first contribution $A_o$ is optical in origin having a first signal amplitude, $A_o$, and is independently known to have a purely linear response to the concentration of the fluorescent-species in the liquid, and the second contribution $A_e e^{j\varphi}$ is an electrical interference signal having a second signal amplitude, $A_e$, is constant and independent of the measurand and has an overall constant phase shift, $\varphi$, with respect to the first contribution.

12. An optical sensor according to claim 11, wherein the signal processor or processing module is configured at least to:

identify real and imaginary components of the total signal $S_{tot}$ to yield:

$$\begin{cases} Re(S_{tot}) = A_o + A_e \cos(\varphi) \\ Im(S_{tot}) = A_e \sin(\varphi) \end{cases} \quad \text{Equation 2)}$$

and construct the magnitude, M, and the phase, $\phi$, by substituting the real and imaginary components, as follows:

$$\begin{cases} M = \sqrt{Re(S_{tot})^2 + Im(S_{tot})^2} \\ \Phi = \tan^{-1}\left(\frac{Im(S_{tot})}{Re(S_{tot})}\right) \end{cases} \quad \text{Equation 3)}$$

13. An optical sensor according to claim 12, wherein the signal processor or processing module is configured at least to:

determine $A_o$ by eliminating the second signal amplitude $A_e$, as follows:

$$A_o = \sqrt{\frac{M^2(2\sin\varphi\tan\Phi\cos\varphi + (\tan\Phi\sin\phi)^2 - (\sin\varphi)^2 + 1)(\sin\varphi - \tan\Phi\cos\varphi)^2}{(\sin\varphi)^2((\tan\Phi)^2 + 1)(\cos\varphi + \tan\Phi\sin\varphi)^2}} \quad \text{Equation 4)}$$

so as to provide an algebraically derived expression for $A_o$, the portion of the signal that has purely linear response to the concentration of the fluorescent-species as predicted optically.

14. An optical sensor according to claim 10, wherein the optical sensor comprises an inductive loop arranged around at least part of the photodiode cathode pad, and configured to receive inductive loop inducing signaling, and provide inductive loop signaling around the at least part of the photodiode cathode pad to provide inductive on the PCB.

15. An optical sensor according to claim 14, wherein the inductive loop comprises:
- a trace having a route along a signal path from a transistor collector pin around an LED anode pad; and
- at least one via placed between LED anode pads to route the trace on a top side of the PCB, the trace being routed alongside, near and around the photodiode cathode pad back to the LED anode of the LED anode pad.

16. An optical sensor according to claim 15, wherein the at least one via comprises other vias placed along the route around the photodiode cathode pad configured to jump over other 2.5V bias connections made to other components on the PCB.

17. An optical sensor according to claim 16, wherein the inductive loop is a ¾ inductive loop around the photodiode cathode pad.

18. An optical sensor having a detector comprising:
- a printed circuit board (PCB) having an optical-electrical component configured to sense an optical signal and provide electrical signaling containing information about the optical signal sensed; and
- an inductive loop arranged around at least part of the optical-electrical component, and configured to receive inductive loop inducing signaling, and provide inductive loop signaling around the at least part of the optical-electrical component to provide inductive on the PCB to reduce or substantially eliminate unwanted electrical interference in electrical signaling provided from the photodiode.

19. An optical sensor according to claim 18, wherein
the optical-electrical component is a photodiode having a photodiode cathode pad; and
the inductive loop is arranged around at least part of the photodiode cathode pad.

20. A method comprising:
- configuring an optical sensor with a detector having a printed circuit board (PCB) that has a photodiode cathode pad with a photodiode;
- arranging an inductive loop around at least part of the photodiode cathode pad;
- receiving inductive loop inducing signaling in the inductive loop; and
- providing inductive loop signaling around the at least part of the photodiode cathode pad to provide inductive crosstalk on the PCB to reduce or substantially eliminate unwanted electrical interference in electrical photodiode signaling provided from the photodiode.

\* \* \* \* \*